(12) United States Patent
Hanna

(10) Patent No.: US 8,503,184 B2
(45) Date of Patent: Aug. 6, 2013

(54) MODULAR COMPUTER CHASSIS SYSTEM AND METHOD

(75) Inventor: John N. Hanna, Austin, TX (US)

(73) Assignee: National Instruments Corporation, Austin, TX (US)

( * ) Notice: Subject to any disclaimer, the term of this patent is extended or adjusted under 35 U.S.C. 154(b) by 662 days.

(21) Appl. No.: 12/770,377

(22) Filed: Apr. 29, 2010

(65) Prior Publication Data

US 2011/0266933 A1    Nov. 3, 2011

(51) Int. Cl.
*H05K 7/00* (2006.01)

(52) U.S. Cl.
USPC ......................................................... 361/747

(58) Field of Classification Search
USPC ................ 361/747, 724–726, 740, 759
See application file for complete search history.

(56) References Cited

U.S. PATENT DOCUMENTS

| | | |
|---|---|---|
| 5,154,456 A | 10/1992 | Moore et al. |
| 5,446,618 A | 8/1995 | Tetsuya et al. |
| 6,246,572 B1 | 6/2001 | Myers et al. |
| 7,021,682 B2 | 4/2006 | Erickson et al. |
| 7,137,855 B2 | 11/2006 | Koughan et al. |

*Primary Examiner* — Jeremy Norris
*Assistant Examiner* — Tremesha S Willis
(74) *Attorney, Agent, or Firm* — Meyertons Hood Kivlin Kowert & Goetzel, P.C.; Jeffrey C. Hood

(57) ABSTRACT

Provided in some embodiment is a module locking device including a first member coupled to a computer chassis during use, a second member coupled to the first member via a hinge. The hinge enables the second member to move between a first position that inhibits removal of one or more modules from the computer chassis during use and a second position that facilitates removal of one or more modules from the computer chassis during use. The module locking device also includes a locking mechanism that selectively locks the second member in the first position to inhibit removal of one or more modules from the computer chassis during use.

14 Claims, 8 Drawing Sheets

MODULAR COMPUTER CHASSIS SYSTEM AND METHOD

BACKGROUND OF THE INVENTION

1. Field of the Invention

This invention relates to a system and method of inhibiting removal of modules from a computer system and more particularly to a device to inhibit unauthorized removal of modules from a chassis.

2. Description of the Related Art

Computer systems often include a number of devices that are connected to one another during operation. For example, a test and measurement computer system often include a chassis (e.g., a PXI chassis) having one or more modules (e.g., PXI modules) residing in one or more slots of the chassis. Modules may include central processing modules, data-acquisition modules, signal generation modules, signal conditioning modules, and the like. Various types and numbers of modules may be provided in a single chassis, thereby providing a computer system with increased amount of operational flexibility.

Chassis are traditionally designed to simplify the removal and installation of modules. A module is physically installed by sliding the modules into one or more slots of the chassis. Conversely, a module is physically removed by sliding the modules out of one or more slots of the chassis. In some instances, the module may include a device that mechanically couples to the chassis to prevent it from unintentionally sliding out of the slot. Often, these types of modular devices include a button/lever that is toggled to firmly secure the module to the chassis, but they typically do not include a locking mechanism that prevents a user from removing the module from the chassis.

Although the ease of removal and installation is often desirable to the intended user, it may be undesirable in certain instances. Where a user has assembled a system to include a chassis having a specific type and arrangement of modules, it may be undesirable for another user to remove one or more of the modules. If, for instance, an unsuspecting user were to remove a calibrated module and replace it with an uncalibrated module, subsequent data obtained may be unreliable, unbeknownst to the original user. Moreover, the ease of removal may facilitate unauthorized removal of a module. For example, in a lab, one technician may "borrow" a module from a colleague's chassis, rendering the system inoperable. Further, modules left unattended in a chassis may be subject to other types of unauthorized removal, such as theft.

Accordingly, there is a desire to provide techniques for selectively inhibiting removal of modules from a computer system chassis.

SUMMARY

Described herein are embodiments relating to a system and method of inhibiting unauthorized removal of modules from a computer system chassis. For example, in one embodiment, provided is a module locking device including a first member coupled to a computer chassis during use, and a second member coupled to the first member via a hinge. The hinge enables the second member to move between a first position that inhibits removal of one or more modules from the computer chassis during use and a second position that facilitates removal of one or more modules from the computer chassis during use. The module locking device also includes a locking mechanism that selectively locks the second member in the first position to inhibit removal of one or more modules from the computer chassis during use.

In another embodiment, provided is a modular computer system. The system includes a chassis having at least one slot configured to house one or more removable computer modules during use. The one or more computer modules are removed from or installed into the chassis via an open end of one or more of the slots. The system also includes a module locking device having a first member coupled to the computer chassis during use and a second member coupled to the first member via a hinge. The hinge enables the second member to move between a first position that blocks at least a portion of an open end of one or more of the slots to inhibit removal of one or more of the modules from the computer chassis during use and a second position that facilitates removal of one or more modules from the computer chassis during use.

In yet another embodiment, provided is a modular computer system including a chassis having at least one slot to house one or more removable computer modules during use. The one or more computer modules are removed from or installed into the chassis via an open end of one or more of the slots. The system also includes a module locking device having a first member coupled to the computer chassis during use, and a second member coupled to the first member. During use, the second member moves relative to the first member and the computer chassis, between a first position that blocks at least a portion of an open end of one or more of the slots to inhibit removal of one or more of the modules from the computer chassis during use and a second position that facilitates removal of one or more modules from the computer chassis during use. The locking device also includes a locking mechanism that selectively locks the second member in the first position to inhibit removal of one or more modules from the computer chassis during use.

BRIEF DESCRIPTION OF THE DRAWINGS

A better understanding of the present invention can be obtained when the following detailed description of the preferred embodiment is considered in conjunction with the following drawings, in which.

Figure 1:
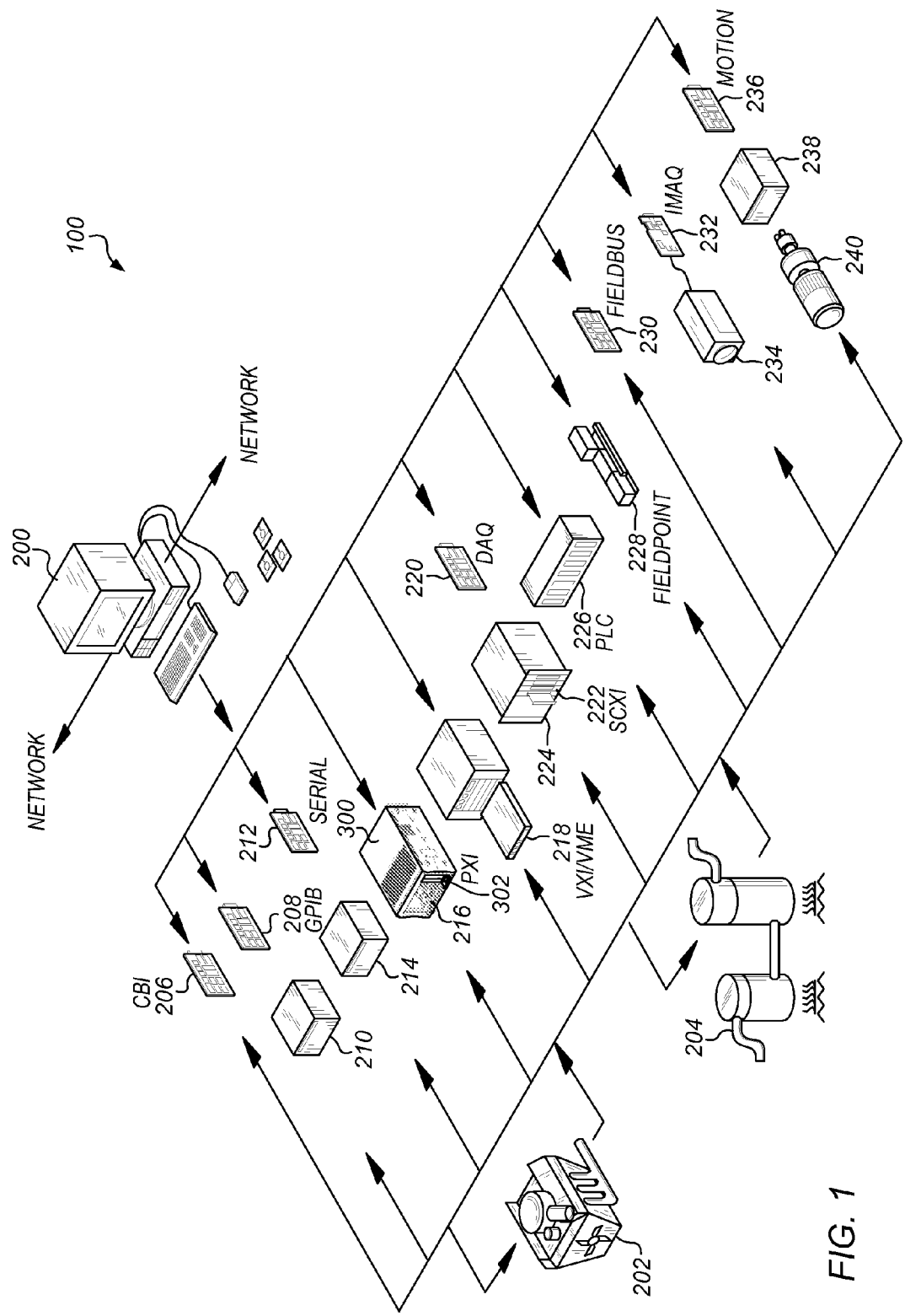
FIG. 1 is a diagram that illustrates a computer system in accordance with one or more embodiments of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (e.g., having the potential to, being able to), not a mandatory sense (e.g., must).

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

As discussed in more detail below, certain embodiments include a device (e.g., a locking device) to prevent unauthorized removal of modules from a chassis. In certain embodiments, a chassis may include a locking device that is capable of blocking the removal of modules from the slots of the chassis. In some embodiments, the device may be provided in a first (closed) position that inhibits a user from removing (e.g., sliding out) modules that are installed in slots of the chassis, and may be provided in a second (opened) position that facilitates a user removing modules from the chassis (e.g., sliding modules into and out of the slots). In some embodiments, the locking device includes a flap member that pivots between the opened and closed positions. In certain embodiments, the device includes a first member fixedly coupled to the chassis and a second member (e.g., a flap/door) pivotally coupled to the first member such that the second member may be disposed in, and rotated between, the opened and closed positions. In the locked position, at least a portion of the device (e.g., a lip of the second member) may extend in front of at least a portion of one or more modules to inhibit (e.g., block) the modules from being slid out of the respective slots of the chassis. In an opened position, the locking device may not inhibit (e.g., may not block) the one or more modules from being slid out of the chassis. In some embodiments, the second member may be selectively locked in the closed position to prevent unauthorized removal of modules from the chassis. In certain embodiments, a locking mechanism (e.g., a keyed fastener) is used to secure the second member in the locked position. For example, the second member may be locked in the closed position using a keyed bolt. Accordingly, subsequent removal of the modules from the chassis may require that a user have access to the key to unlock the locking mechanism to enable moving the second member into the opened position to facilitate removal of modules from the chassis and installation of modules into the chassis.

FIG. 1 illustrates an exemplary measurement/control system ("computer system") 100 that may implement one or more embodiments of the present technique. Computer system 100 may include various combinations of hardware and software that include devices that can be used to implement various computer based processes.

In the illustrated embodiment, computer system 100 includes a host computer system 200. Host computer system 200 may be operable to execute computer programs/routines that provide various computer related functions. Host computer system 200 may include various components such as central processing unit (CPU) and a memory medium. The memory medium may include a tangible non-transitory computer readable storage medium, such as random access memory (RAM), flash memory, hard-drives, and/or CD-ROMs, or the like. The memory medium may have program instructions stored thereon that are executable (e.g., by CPU) to implement one or more computer implemented methods. In the illustrated embodiment, host computer system 200 includes a display device (e.g., a monitor), an alphanumeric input device (e.g., a keyboard), and a directional input device (e.g., a mouse). In some embodiments, host computer system 200 may include modular and/or plug-in boards/cards (e.g., with either commercially available or proprietary hardware) that may be added via a number of expansion slots internal or external to the computer body. For example, host computer system 200 may include PCI/PCI Express slots and PCI/PCI Express cards disposed therein. As described in more detail below, host computer system 200 may be connected to one or more devices, such as an expansion chassis for connecting to a various number and combination of devices. In certain embodiments, host computer system 200 and/or other portions of computer system 100 may be connected to one or more other devices via a network, such as an internal network (e.g., a local area network (LAN)) and/or an external network (e.g., the internet). In certain embodiments, host computer system 200 may be used for various input/output (I/O) functions and processing tasks. For example, host computer system 200 may be used for data acquisition (DAQ) (e.g., when a DAQ digitizing board is installed in computer 200 or a device coupled thereto, such as a chassis, and associated software is run).

Host computer system 200 may be configured to connect/communicate with other instruments/devices of computer system 100. In some embodiments, host computer system 200 may operate with the one or more devices of computer system 100 to generate and provide data, to acquire data, to analyze data. For example, computer system may communicatively couple to and control one or more devices 202, processes 204, or the like. Host computer system 200 may operate with the one or more devices in communication with device 202 or process 204 to perform an automation function, such as MMI (Man Machine Interface), SCADA (Supervisory Control and Data Acquisition), portable or distributed data acquisition, process control, advanced analysis, or other data acquisition and control functions. For example, computer system 100 may be used to implement data acquisition and control applications, test and measurement applications, image acquisition and processing application, machine vision processing applications, process control applications, man-machine interface applications, simulation applications, hardware-in-the-loop validation applications, motion control applications, computer based instruments (CBI) applications, signal conditioning (SCXI) applications, or the like. One or more of the instruments/devices of computer system 100 may include a programmable hardware element, using an FPGA or a processor and memory, and/or one or more portions of user code.

Computer system 100 may include a variety of devices. For example, computer system 100 may include modular instrumentation devices 205, such test and measurement devices manufactured by National Instruments Corporation, headquartered in Austin, Tex. In some embodiments, computer system 100 may include computer based instrumentation (CBI) 206, such as a digital multi-meter (DMM), an oscilloscope (SCOPE), a radio-frequency (RF) device (e.g., up-converter or down-converter), an arbitrary waveform generator (ARB), or the like. Computer system 100 may include general purpose interface bus (GPIB) device 208, such as a modular GPIB card used to communicate with a GPIB device 210 (e.g., an oscilloscope) via a GPIB communication protocol. Computer system 100 may include a serial device 212, such as a modular serial card used to communicate with a serial device 214 (e.g., an oscilloscope) via a serial communication protocol. Computer system 100 may include a (PXI) device 216, such as a PXI chassis 300 having PXI form factor modular devices (e.g., modules) 302 installed therein. Computer system 100 may include a (VXI/VME) device 218, such as a VXI/VME chassis having VXI/VME form factor modular devices (e.g., VXI/VME controllers/modules) installed therein. Computer system 100 may include data acquisition (DAQ) device 220, such as modular instrumentation including data input/output (I/O) interfaces for receiving, transmitting, conditioning, and/or processing signals (e.g., digital and analog signals). Computer system 100 may include signal conditioning (SCXI) devices 222 that can be used to condition and/or route signals, such as I/O signals as those transmitted/received at DAQ device 220. SCXI device 222 may include a chassis 224 having \devices 222 installed therein (e.g., a relay/switch module). Computer system 100 may include a programmable logic controller (PLC) 226, such as a PLC used for the automation of electromechanical process. Computer system 100 may include a distributed I/O module, such as a fieldpoint module 228. Computer system 100 may include a distributed control module, such as a fieldbus module 230. Computer system 100 may include an image acquisition (IMAQ) system, such as a modular IMAQ module 232 and an associated IMAQ device (e.g., camera) 234. Computer system 100 may include a motion control system, such as a modular motion controller device 236, a motor drive 238, and a motor 240. Computer system 100 may include any variety of other devices. Although some of the devices are illustrated in association with a chassis (e.g., modules) and some or illustrated independent from a chassis (e.g., card or standalone devices), embodiments may include all or some of the described device being provided in a module form factor to be housed in a chassis and/or a card form factor be installed in computer 200. For example, PXI device 216 may include a PXI chassis housing any combination of modular CBI devices, GPIB devices, serial devices, SCXI devices, DAQ devices, IMAQ devices, motion devices, or the like. The devices may also be provided in a PCI form factor and installed in PCI slots of computer 200.

Figure 2:
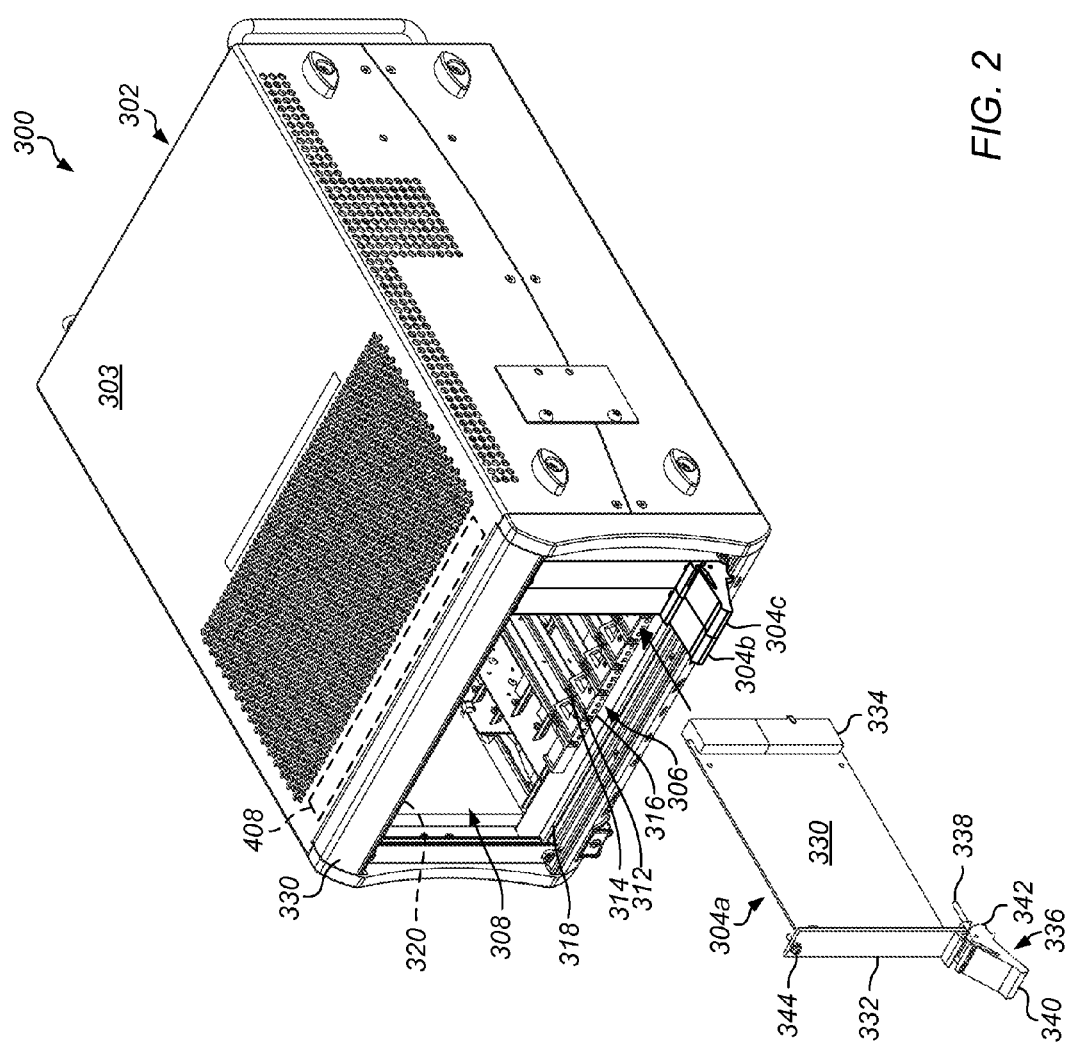
FIG. 2 is a diagram that illustrates a chassis system in accordance with or more embodiments of the present technique.

FIG. 2 illustrates a chassis system 300 in accordance with in accordance with or more embodiments of the present technique. In some embodiments, chassis system 300 includes a computer chassis housing one or more modular computer devices. In the illustrated embodiment, chassis system 300 includes a chassis 302. Chassis 302 may include a rigid enclosure having a plurality of slots or bays for housing one or more modular computer devices. In the illustrated embodiment, chassis 302 includes an enclosure 303 having a plurality of internally provided slots 306. More specifically, the illustrated embodiment, chassis 302 includes an eight-slot PXI chassis 302. Seven of slots 306 are designed to house peripheral modular devices, and one slots (to the far left of the illustrated chassis 302) is designed for housing controller devices. In the illustrated embodiment, chassis 302 has two modular computer devices 304b and 304c installed two of slots 306. The illustrated embodiment also depicts a third modular device 304a that is currently uninstalled from chassis 302. Other embodiments may include any number of slots and slot configurations. Modules 304 may include "3U" PXI modular devices. Although several of the embodiments described and illustrated herein relate to a PXI chassis system, the techniques described herein may apply to various chassis systems, such as VXI/VME chassis systems. Moreover, the techniques described herein may be applicable to different PXI chassis models (e.g., a chassis having fewer or more than eight slots).

Enclosure 303 may include a rigid frame/housing. In some embodiments, enclosure 303 may be formed of metal, such as one or more sheet of aluminum or steel. As depicted, slots 306 may extend internally into enclosure 303. For example, slots 306 may each extend from an opening 308 at a front end of enclosure 304 toward a rear portion of enclosure 303. In some embodiments, opening 308 is surrounded by a bezel 330 that extends about the top, bottom and/or sides of opening 308. A rear portion of chassis 302 and enclosure 303 may include a backplane that facilitates communication with modules 304. Thus, a front end of chassis 302/enclosure 303 may be defined as an end of chassis 302/enclosure 303 where modules are inserted and removed. Further, a front end of chassis 302/enclosure 303 may include an end of chassis 302/enclosure 303 where a substantial amount of user accessible input/output (I/O) and/or user interfaces are located during use. A rear end of chassis 302/enclosure 303 may be defined as an end of chassis 302/enclosure 303 comprising a backplane connector that is complementary to connectors of one or more modular devices 304.

Chassis 302 may include guides 310 coupled to one or more portions of enclosure 303. In some embodiments, guides 310 may include elongated slots/tracks that facilitate installation and retention of modules 304. For example, in the illustrated embodiment, each of guides 310 includes a slot 312, a grounding terminal 314, and alignment holes 316. Slot 312 may includes elongated recess that is engaged by a complementary edge of a printed circuit board (PCB) of module 304. Engagement of the slot 312 and board edge may guide insertion of module 304 into slot 306. Grounding terminal 314 may include a terminal that engages a complementary grounding contact located at or near an edge of a PCB of an inserted module 304. Grounding terminal 314 may be electrically coupled to a ground location (e.g., a frame of enclosure 303) to facilitate dissipation of charges from module 304. In some embodiments, grounding terminal 314 may be located toward a front end of guide 310 such that it is engaged by a complementary grounding connector of module 304 while it is being slid into slot 306 to facilitate the grounding of module 304 occurring prior to full/complete insertion of module 304 into slot 306 (e.g., prior to a connector of module 304 coupling to a complementary backplane connector). Alignment holes 316 may be engaged by a complementary pin/protrusion of module 304 to facilitate alignment of module 304 in slot 306.

Chassis 302 may include one or more rails proximate a front end of the chassis that are used to secure the modular computer devices to the chassis. In the illustrated embodiment, chassis 302 includes a lower front rail 318 and an upper front rail 320 (not visible) that run along the lower edge and upper edge, respectively, of opening 308. The lower front rail 318 and the upper front rail 320 may facilitate installation and securing of modules to chassis 302, as described in more detail below.

Modular computer devices ("modules") 304 may include various computing devices, such as central processing modules, data-acquisition modules, signal generation modules, signal conditioning modules, or the like. For example, modules 304 may include modular CBI devices, GPIB devices, serial devices, SCXI devices (such as switches/relays), DAQ devices, IMAQ devices, motion devices, or the like. Various types and numbers of modules may be provided in single chassis. The ability to mix-and-match various types of modules may facilitate providing a computer system with increased amount of operational flexibility. In some embodiments, a plurality of chassis may be interconnected to provide additional flexibility in configuring a computer system. For example, two eight slot chassis may be interconnected to provide a single system capable of coordinating operation of sixteen modules.

Modules 304 may include various physical features that facilitate installation and operation of the module within chassis. For example, in the illustrated embodiment, module 304a includes a PCB 330, a front panel 332, a rear connector 334, and a latching mechanism 336. PCB 330 may mechanically support and electrically couple electronic components (e.g., integrated circuits) using conductive pathways, tracks or traces etched from copper sheets laminated onto a non-conductive substrate, for example. Front panel 332 may provide for enclosing at least a respective portion of opening 308 when module 304 is installed in chassis 302. Front panel 332 may include a substantially flat and rigid (e.g., metal) plate that extends from lower front rail 318 to upper front rail 320 when installed. In some embodiments, front panel 332 may provide a location for I/O interfaces (e.g., electrical connectors/plugs) of module 304a. For example, front panel 332 may include one or more I/O connectors that enable communication/data cables to be connected to module 304a via front panel 332. Rear connector 334 may interface with a complementary backplane connector of chassis 302 when module 304 is installed into chassis 302. Rear connector 334 may provide for the communication/transmission of signals with other portions of computer system 100.

In some embodiments, modules 304 may be physically installed into chassis 302 by sliding each respective module 304 into one or more slots 306 of chassis 302. For example, a single slot module may be slid into a single slot 306 of chassis 302. A wider module (e.g., a two slot module) may be slid into two or more adjacent slots of chassis 302. Conversely, modules 304 may be physically uninstalled from chassis 302 by sliding each respective module 304 out of one or more slots 306 of chassis 302.

In some embodiments, modules 304 may mechanically couple to chassis 302 to inhibit module 304 from unintentionally sliding out of its respective slot 306. In the illustrated embodiment, for example, modules 304 include fastening devices 336 that engages lower front rail 318. Each fastening device 336 may be actuated during installation to facilitate fully seating each of the modules 304. For example, as module 304 is advanced into slot 306, a guiding pin 338 may align with and engage a complementary aligning hole 316 located at a front end of one of guides 310. Once module 306 is partially inserted, a full seating of module 304 may be accomplished by actuating fastening device 336 to draw module 304 into the fully seated/installed position. For example, in the illustrated embodiment, fastening device 336 includes a lever 340 that is moved upward to cause fingers 342 to engage lower front rail 318 of chassis 302. More specifically, as lever 340 is advanced upward, fingers 342 engage a rear edge/lip of lower front rail 318 to pull/draw module 304 into a seated/installed position within slot 306. In the illustrated embodiment, modules 304b and 304c are fully inserted, as indicated by lever 340 being disposed in the up position. In some embodiments, engagement of fastening device 336 may help to ensure that module 304 is completely installed into chassis 302 (e.g., that rear connector 334 of module 304 has fully engaged a complementary backplane connector of chassis 300). Fastening device 336 may or may not include a locking mechanism that prevents a user from removing the module from chassis 302.

In some embodiments, modules 304 may be coupled to chassis 302 using a variety of fasteners. For example, in the illustrated embodiment, modules 304 are coupled to chassis 302 using a threaded fastener (e.g., a screw) 344 that extends through a top end of front panel 332. When installed, screw 344 is fastened to a complementary threaded hole in upper front rail 320. Screw 344 may include a common type of screw, such as a Phillips head, flat-head, hex-head screw that can be tightened or loosened using a common tool, such as a screw driver or an Allen wrench. In some embodiments, a module 304 may be coupled to chassis 302 using a combination of techniques. For example, in the illustrated embodiment, modules 304 may be coupled to lower front rail 318 via fastening device 336, and may be also fastened to upper front rail 320 via screw 344. Other embodiments may include any combination of fasteners. For example, modules 304 may be coupled to chassis 302 using any combination of screws at both top and/or bottom ends of front panel 332, fastening devices 336 at the top and/or bottom ends of modules 304. The fasteners may not be keyed, such that modules 304 may be removed using common tools.

Figure 3:
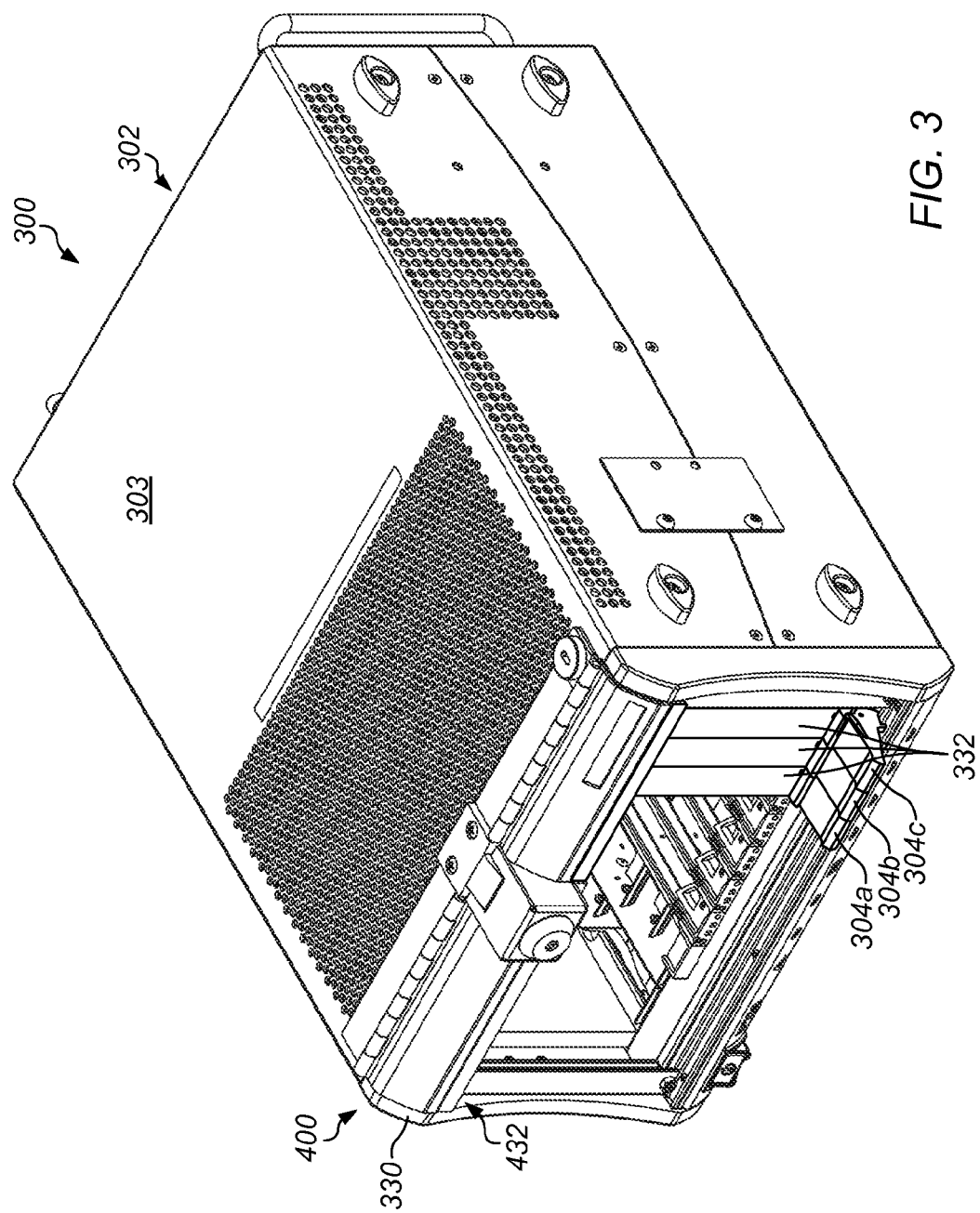
FIG. 3 is a diagram that illustrates an embodiment of the chassis system having a locking device in accordance with one or more embodiments of the present technique.
Figure 4A:
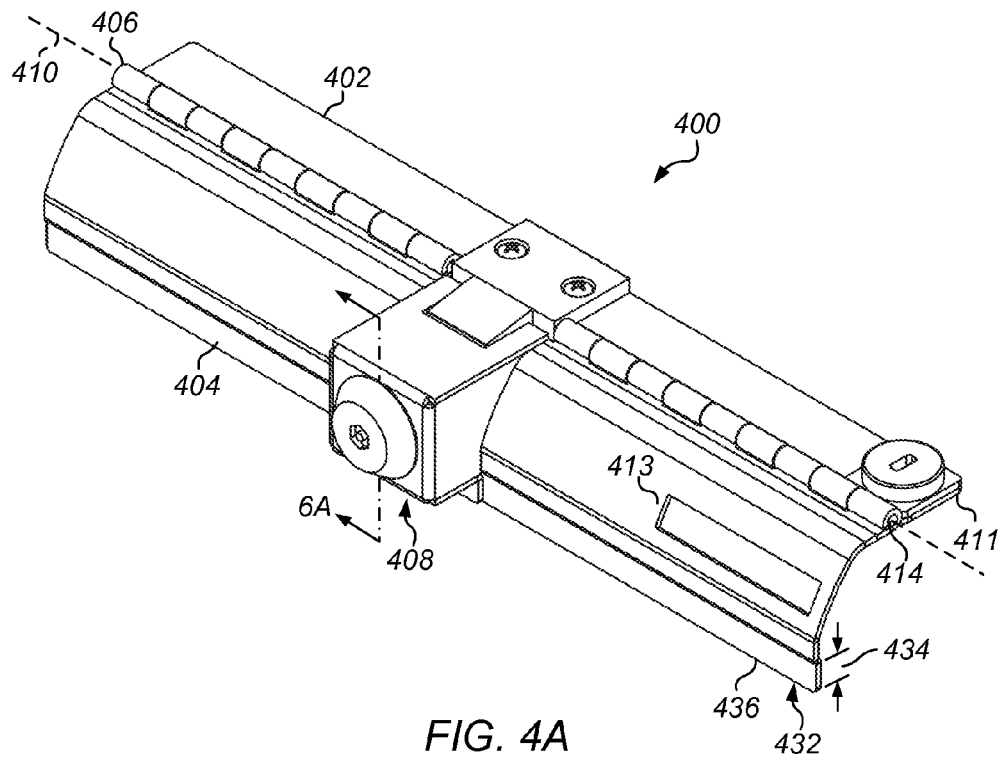
FIGS. 4A and 4B are illustrations that depict isometric views of the locking device in accordance with one or more embodiments of the present technique.
Figure 4B:
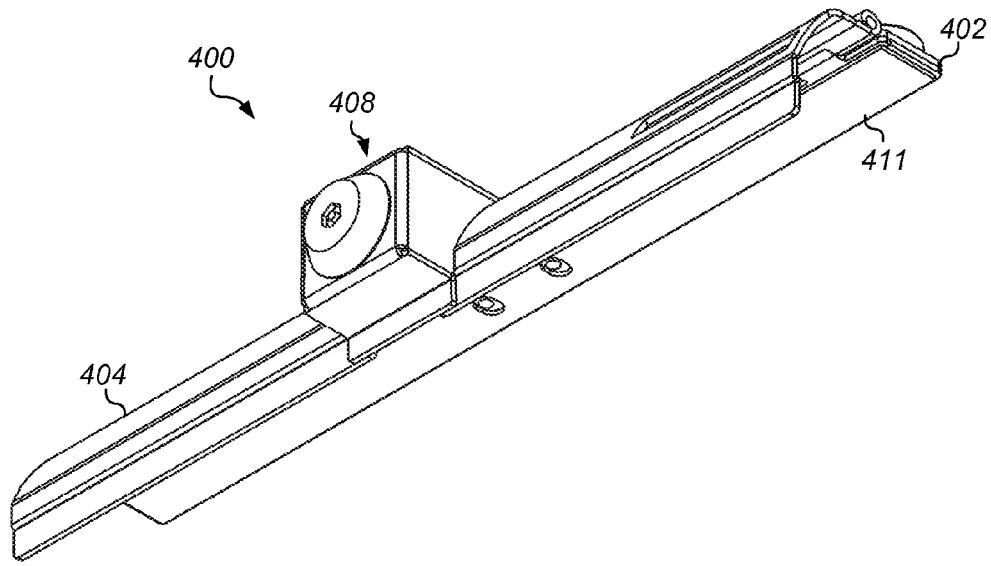
Figure 5:
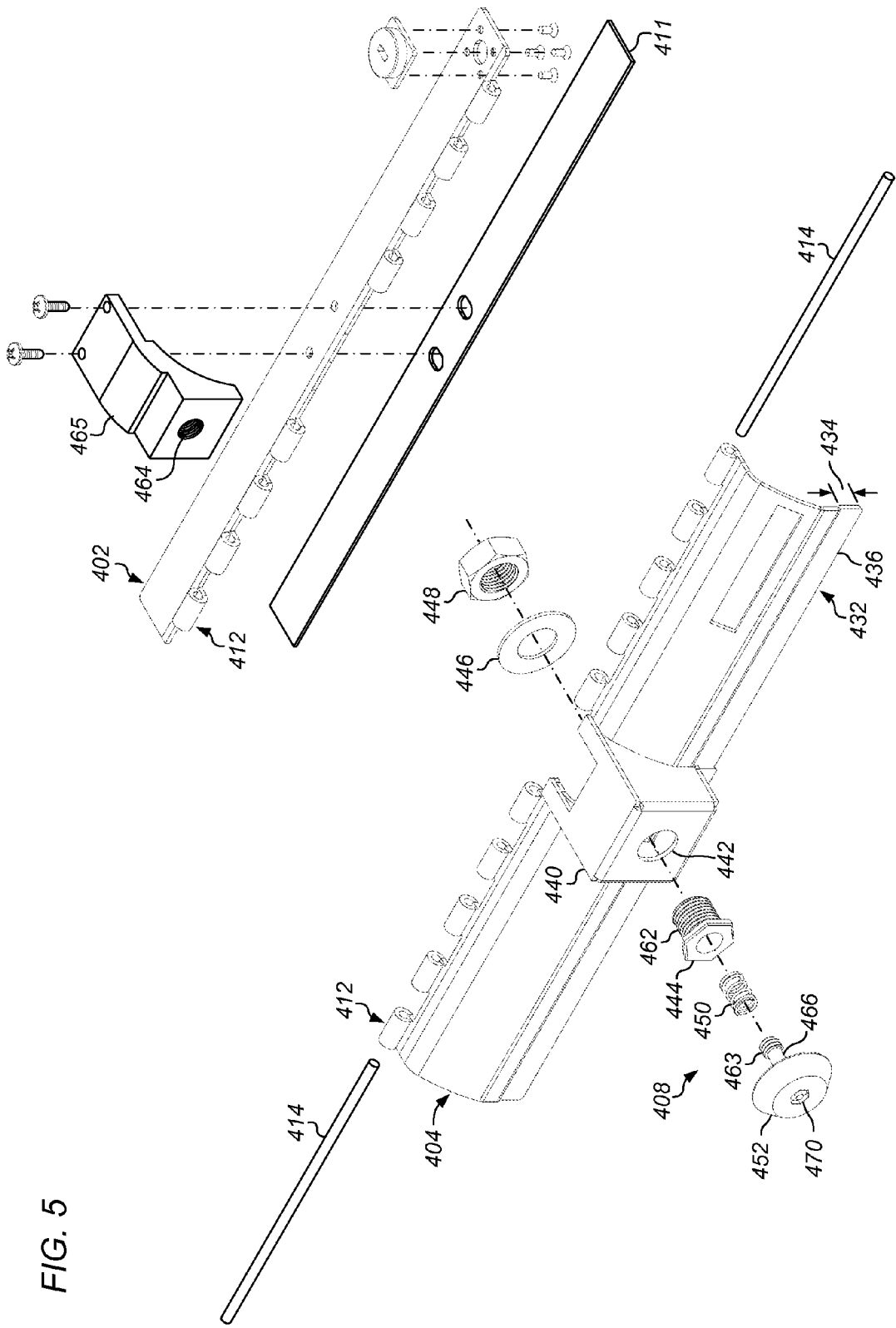
FIG. 5 is an illustration of an isometric exploded view of the locking device in accordance with one or more embodiments of the present technique.
Figure 6A:
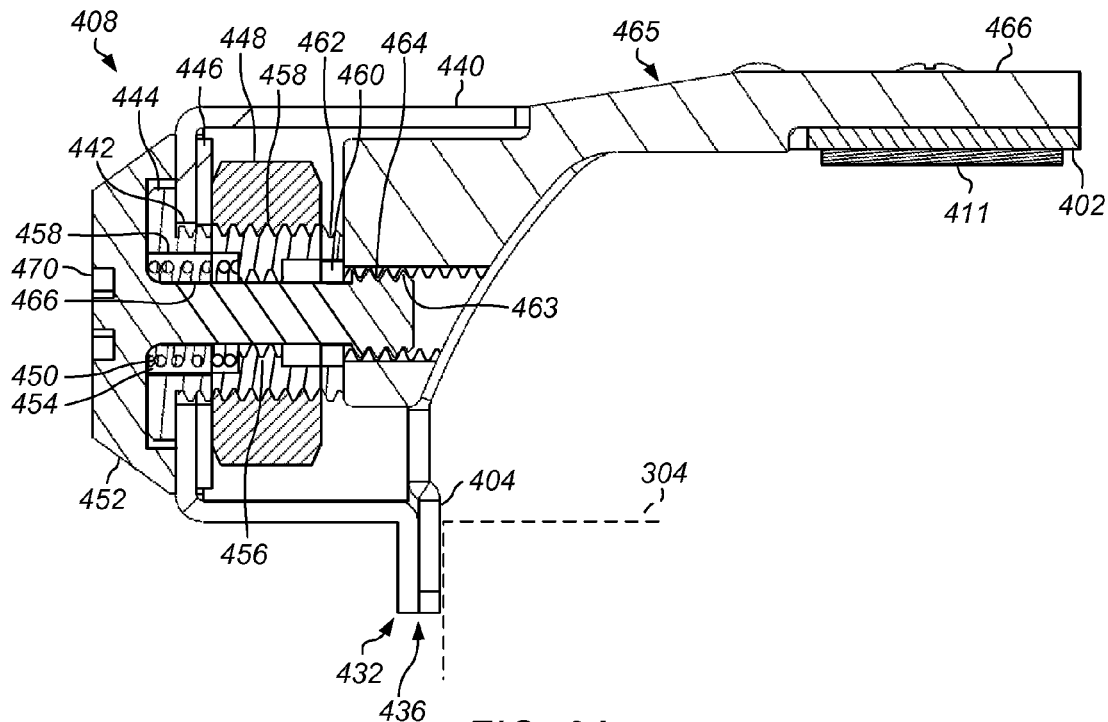
FIGS. 6A-6C are cross-sectional side views of the locking device in accordance with one or more embodiments of the present technique.
Figure 6B:
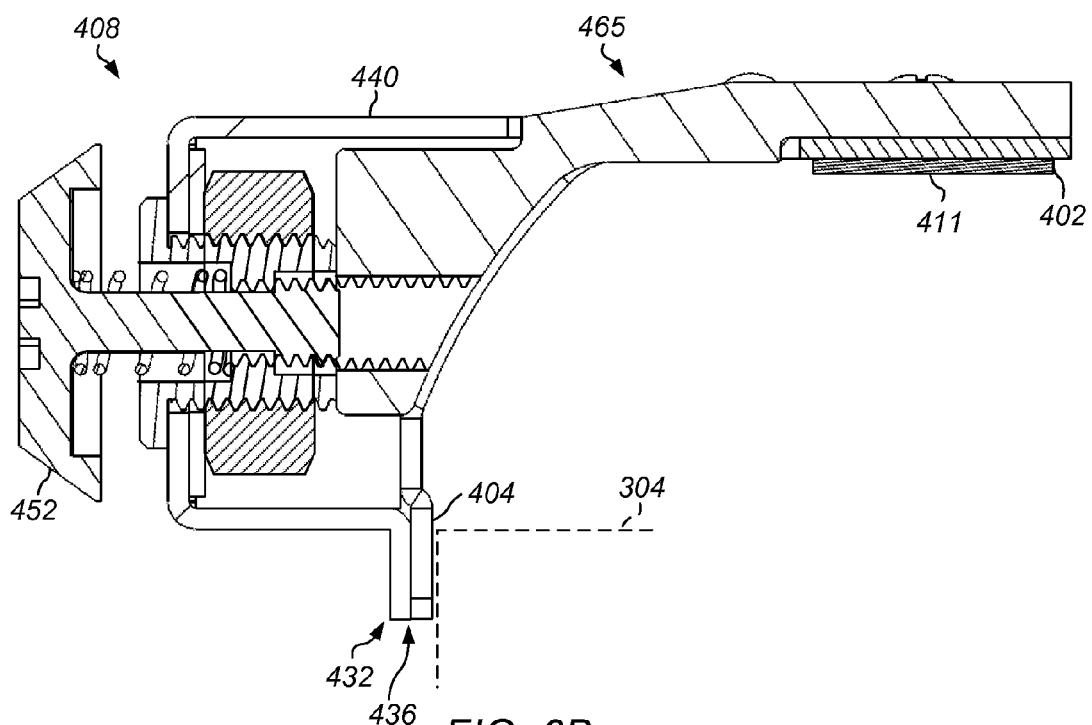
Figure 6C:
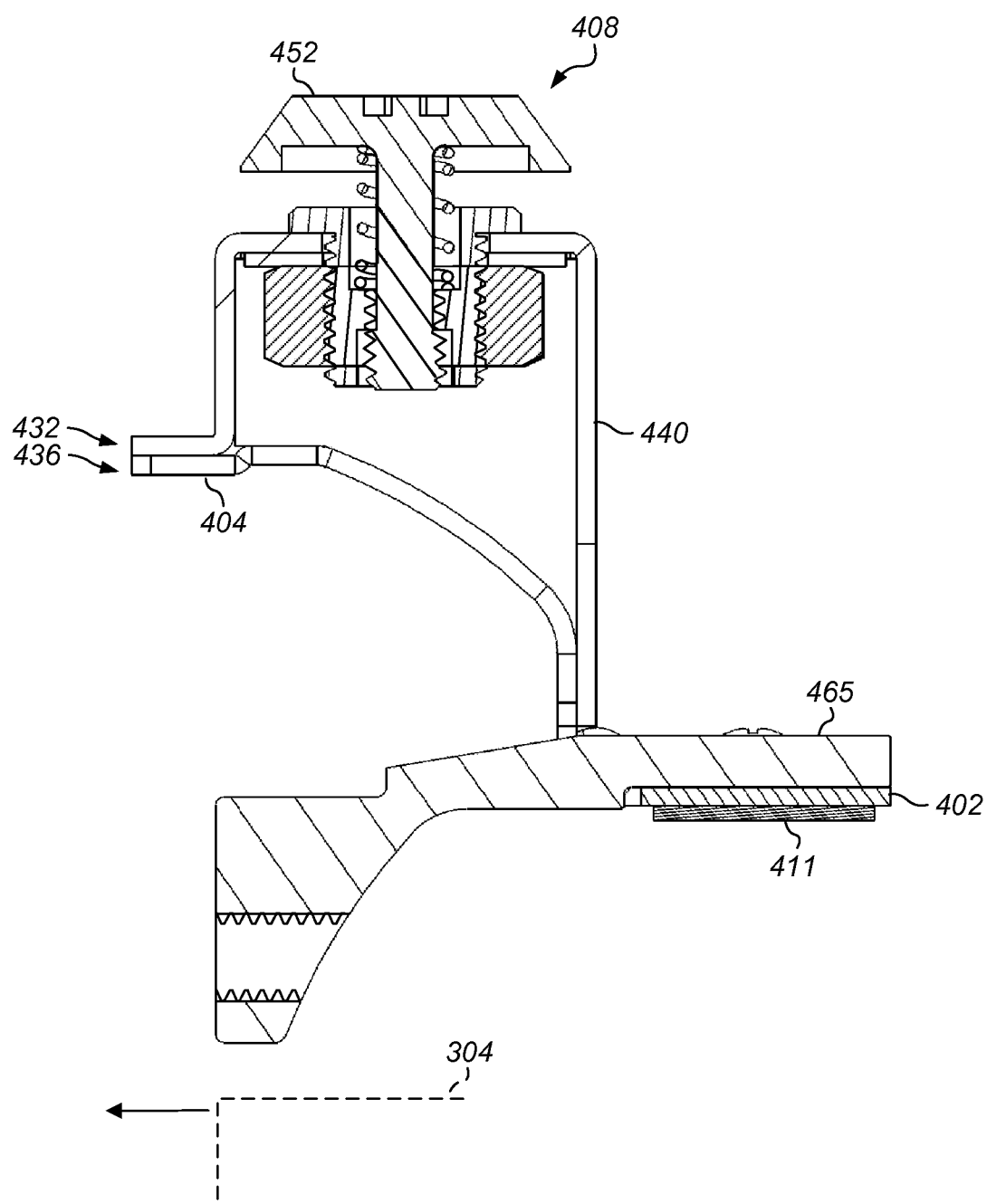

FIG. 3 illustrates chassis system 300 including a locking device 400 in accordance with one or more embodiments of the present technique. FIGS. 4A and 4B illustrate isometric views of locking device 400 in accordance with one or more embodiments of the present technique. FIG. 5 illustrates an isometric exploded view of locking device 400 in accordance with one or more embodiments of the present technique. FIGS. 6A-6C are cross-sectioned side views of locking device 400 in accordance with one or more embodiments of the present technique. FIG. 6A includes a cross-sectioned view of locking device 400 in a locked position taken across section 6A-6A of FIG. 4A. FIGS. 6B and 6C illustrate similar cross-sections of locking device 400 in unlocked and opened positions, respectively, in accordance with one or more embodiments of the present technique. FIG. 6A-6C also include a module 304 illustrated in dashed lines to indicate its relative position to locking device 400 during use. Note, module 304 be inhibited from removal in FIGS. 6A and 6B, and may be removed as indicated by the arrow in FIG. 6C.

Locking device 400 may that is capable of blocking the removal of modules 304 from slots 306 of chassis 302. In some embodiments, locking device 400 may be provided in a first (closed) position that inhibits a user from removing (e.g., sliding out) modules 304 that are installed in slots 306 of chassis 302, and may be provided in a second (opened) position that facilitates a user removing modules 304 from chassis 302 (e.g., sliding modules into and out of the slots). In some embodiments, locking device 400 includes a flap member that pivots between the opened and closed positions. In certain embodiments, device 400 includes a first member fixedly coupled to chassis 302/enclosure 303 and a second member (e.g., a flap/door) pivotally coupled to the first member such that the second member may be disposed in, and rotated between, the opened and closed positions. In the locked position, at least a portion of locking device 400 (e.g., a lip of the second member) may extend in front of at least a portion of one or more modules 304 to inhibit (e.g., block) the modules from being slid out of the respective slots 306 of chassis 302. In an opened position, locking device 400 may not inhibit (e.g., may not block) the one or more modules 306 from being slid out of chassis 302. In some embodiments, the second member may be selectively locked in the closed position to prevent unauthorized removal of modules 304 from chassis 306. In certain embodiments, a locking mechanism (e.g., a keyed fastener) is used to secure the second member in the locked position. For example, the second member may be locked in the closed position using a keyed bolt. Accordingly, subsequent removal of modules 304 from chassis 302 may require that a user have access to the key to unlock the locking mechanism to enable moving the second member into the opened position to facilitate removal of modules 304 from chassis 302 and installation of modules 304 into chassis 302.

In the illustrated embodiment, locking device includes a first member 402, a second member 404, a hinge 406, and a locking mechanism 408. During use, second member 404 may rotate relative to first member 402 about hinge 406 and hinge axis 410. In some embodiments, first member 402 fixedly couples to a portion of chassis 302 (e.g., enclosure 303) proximate opening 308 such that second member 404 can be pivoted between a first (locked) position and a second (opened) position. In the locked position a portion of second member 404 may be disposed in front of modules 304 installed in slots 306 of chassis 302 to inhibit removal of them from chassis 302. In the unlocked position second member 404 and other portions of locking device 400 may not be disposed in front of modules 304 installed in slots 306 of chassis 302, thereby facilitating removal of them from chassis 302.

In some embodiments, fixation area 408 is provided on a portion of enclosure 303, and is not provided on a portion of bezel 330 surrounding opening 308. In some embodiments, some or all of fixation area may be provided on a surface of bezel 330. Providing some or all of the fixation area 408 on enclosure 303 may enhance the coupling of locking device 400, in some embodiments. For example, where bezel 330 is removable, if fixation area 408 was limited only to the surface of bezel 330, locking device 400 may be removed by simply removing bezel 330, providing minimal security against unauthorized users. In contrast, providing fixation area 408 on a secure/non-removable portion of chassis 302, such as enclosure 303, may enhance security as an unauthorized user would have to perform substantial disassembly of chassis to 300 to remove a module 304 installed in one of slots 306.

In some embodiments, first member 402 includes a shape that is complementary to a portion of chassis 302 that the first member 402 is coupled to during use. For example, in the illustrated embodiment, first member 402 includes an elongated flat plate member having a shape (e.g., flat bottom surface) complementary to the flat surface of a fixation area 408 (see FIG. 2). Fixation area 408 may include a flat surface of chassis 302 at or near opening 308. In some embodiments, fixation area 408 is located on a flat-top surface of enclosure 303, as depicted.

In some embodiments, first member 402 is coupled to fixation area 408 via an adhesive. For example, first member 402 may be coupled to fixation area 308 via an adhesive strip 411 (see FIGS. 4B, 5 and 6A-6C). In some embodiments, adhesive strip 411 may include a double sided adhesive tape that adhere a bottom surface of member 402 to fixation area 408 when first member 402 and strip 411 is pressed against fixation area 408. In some embodiments, an adhesive (e.g., glue) may be used in place of or in conjunction with adhesive tape. For example a bead of glue may be provided between a bottom surface of first member 402 and fixation area 408.

In some embodiments, first member 402 is coupled to chassis 302 via mechanical fasteners. For example, screws or bolts may be used to couple first member 402 to the top surface of enclosure 303. In some embodiments, holes to accept the fasteners may be pre-drilled into enclosure. In some embodiments, holes to accept the fasteners may be drilled/tapped into enclosure 303 at the time of installing locking device 400. In some embodiments, first member 402 is coupled to chassis 302 via a combination of mechanical fasteners and adhesives.

In some embodiments, hinge 406 may be integrated into first member 402 and second member 404. For example, in the illustrated embodiment, first member 402 and second member 404 each include a series of hinge sockets 412 integrally formed at an edges of each of the members. When mated together, hinge sockets 412 define a channel for the insertion of hinge pins 414. During use, hinge pins 414 are aligned along hinge axis 410, and guide pivoting of second member 404 about hinge axis 410, relative to first member 402.

In some embodiments, second member 404 includes a shape that is complementary to a portion of chassis 302 that the second member 404 is provided proximate to during use. In the illustrated embodiment, second member 404 includes an elongated curved/bent plate member having a shape complementary to the edge of enclosure 303 and/or bezel 330 at a top of opening 308. In some embodiments, second member 404 may includes a flat plate that subjected to series of bends to match the shape of bezel 330. In some embodiments, second member 404 may includes a molded plate that is molded to match the shape of bezel 330. In some embodiments, second member 404 may include a cutout to enable access to certain features of chassis 302. For example, in the illustrated embodiment second member 404 includes a cutout (e.g., window) 413 that enable a user to view a model number of chassis 302 printed on bezel 330, while second member 404 is disposed in the closed position.

In some embodiments, second member 404 is sized such that at least a portion of it extends to block at least a portion of modules 304 disposed in slots 306. For example, in the illustrated embodiment, second member 404 includes a lip 432 that extends in-front of opening 308 to block removal of modules 304. In some embodiments, lip 432 is sized to a length 434 (see FIG. 5) such that a edge 436 of lip 432 extends to anywhere from about ⅛ inch to about 1 inch or more into opening 308 when provided in the locked position. Lip 432 may thus, prevent a user from removing modules 304 as it will contact at least a portion of front panel 332 of a module 402 as the user attempts to slide the module 402 out of its slot 306 (see FIGS. 6A and 6B). When second member 404 is provided in the opened position, lip 432 may be swung up and out of the way such that the module 404 will have a clear path to be slid out of its slot 306 (see FIG. 6C).

In some embodiments, locking mechanism 408 may provide for securing second member 404 into the locked position. When locking mechanism 408 is locked, second member 404 may be secured in the down/locked position. When locking mechanism 408 is unlocked, second member 404 may not be secured in the down/locked position, such that it may be rotated between the closed and opened positions.

In some embodiments, locking mechanism 408 includes a housing 440 coupled to second member 404. For example, locking mechanism may include a hollow enclosure that is welded, glued, screwed or otherwise coupled to second member 404. During use, housing 440 may support various components of locking mechanism 408, and may inhibit access to the internals of locking mechanism 408 to prevent a user from tampering with locking mechanism 408. As depicted, housing 440 may include an opening 442 that extends through a front face of housing 440.

Locking mechanism 408 may include a keyed locking device that may require the use of special tools to lock and/or unlock it. In the illustrated embodiment, locking mechanism 408 includes a bolt 444, a washer 446, a retaining nut 448, a spring 450, and a keyed fastener 452. Bolt 444 includes a hollow passage 454 having an internally threaded middle section 456, a first recess 458 extending from its head, a second recess 460 extending from its threaded end opposite the head, and an external thread 462 extending substantially along its length. During assembly, the externally threaded 462 end of bolt 444 is disposed through hole 442 and is secured to housing 440 via washer 446 and retaining nut 448 threaded about external thread 462. Spring 450 is then inserted into first recess 458 prior to assembling of keyed fastener 452. Keyed fastener 452 includes a first end having a male threaded tip 463 that may be complementary threaded to internally threaded middle section 456 and/or a threaded passage 464 of a locking member 465 fastened to first member 402. Locking member 465 may be coupled to or formed integrally with first member 402. For example, locking member 465 may include a tab 466 that is coupled to first member 402 via mechanical fasteners (e.g., screws). Keyed fastener 452 may also include a necked portion 466 that extends from an end of male threading 463 to a head of keyed fastener 452. Necked portion 466 may have a reduced diameter (e.g., smaller than the internal diameter of threaded middle section 456) to enable it to slide freely within threaded middle section 456 when assembled. Threaded tip 463 may be fed through spring 450 and threaded through threaded middle section 456 such that necked portion 466 is disposed within threaded middle section 456 of bolt 444. Spring 450 may bias keyed fastener 452 into an unlocked position (e.g., biased away from engagement with threaded passage 464 as depicted in FIG. 6B). To lock locking mechanism 408, keyed fastener 452 may be depressed inward (e.g., to counter the bias of spring 450) and rotated, such that threaded tip 463 engages and couples to threaded passage 464. When keyed fastener 452 is engaged to locking member 465 (e.g., in the locked position, as depicted in FIG. 6B), keyed fastener 452 may secure second plate 404 in the closed/down/locked position. When keyed fastener 452 is not engaged to locking member 465 (e.g., in the unlocked position as depicted in FIG. 6b), keyed fastener 452 may not secure second plate 404 in the closed/down position, and thereby enabling second plate 404 to be swung upward into the opened position (e.g., as depicted in FIG. 6C).

In some embodiments, keyed fastener 452 may include a keyed device that inhibits a user from unlocking or lock locking mechanism without having a tool such as a screw driver. In some embodiment, locking device includes a keying feature 470, such that a user may not unlocking or lock locking mechanism without having a key or keyed-tool. For example, in the illustrated embodiment, keyed fastener includes a security-hex-keyed socket 470 that may be engaged with a complementary sized security-hex wrench.

Figure 7:
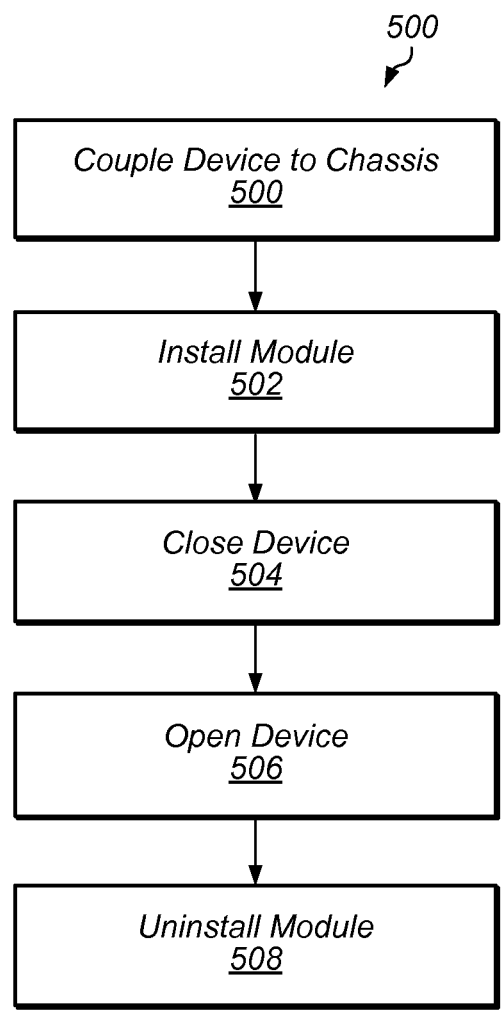
FIG. 7 is a flow chart that illustrates a method of using the locking device in accordance with one or more embodiments of the present technique.

FIG. 7 is a flow chart that illustrates a method 500 of using locking device 400 in accordance with one or more embodiments of the present technique. Method 500 may include coupling a device to a chassis, as depicted at block 502. In some embodiments coupling a device to a chassis includes a user coupling locking device 400 to chassis 302. For example, a user may couple locking device 400 to fixation area 408 via use of an adhesive (e.g., adhesive tape). Method 500 may also include installing a module, as depicted at block 502. In some embodiments, installing a module includes installing one or more modules 304 into slots 306 of chassis 302. Method 500 may also include closing the device, as depicted at block 504. In some embodiments, closing the device may include providing second member 404 in a closed position. For example, second member 404 may be provided in a closed position, and keyed fastener 452 may be engaged to lock second member 404 in the closed potions, thereby locking installed modules 304 into chassis 302. Method 500 may include opening the device, as depicted at block 506. In some embodiments, opening the device may include providing second member 404 in an opened position. For example, keyed fastener 452 may be disengaged to unlock second member 404 from the closed position, thereby enabling second member 404 to be swung into the opened position. Method 500 may include uninstalling a module, depicted at block 508. In some embodiment, uninstalling a module may include uninstalling one or more modules that were installed in chassis 300. For example, with the second member 404 swung into the opened position, modules 304 previously installed may be slid from slots 306 of chassis 302. Method 500 is an exemplary method of using chassis system 300 described herein. Other embodiments may include the omission of steps, the addition of steps, and/or providing steps in a different order.

Although the embodiments above have been described in considerable detail, numerous variations and modifications will become apparent to those skilled in the art once the above disclosure is fully appreciated. It is intended that the following claims be interpreted to embrace all such variations and modifications. Furthermore, note that the word "may" is used throughout this application in a permissive sense (e.g., having the potential to, being able to), not a mandatory sense (e.g., must). The term "include", and derivations thereof, mean "including, but not limited to". As used in this specification, the singular forms "a", "an" and "the" include plural referents unless the content clearly indicates otherwise. Thus, for example, reference to "a device" includes a combination of two or more devices. The term "coupled" means "directly or indirectly connected".

I claim:

1. A module locking device, comprising:
   a first member coupled to a first surface of a computer chassis during use, wherein the computer chassis comprises one or more slots configured to house one or more modules during use, wherein the one or more modules are configured to be removed from, or inserted into, the computer chassis via respective open front ends of the one or more slots, and wherein the first surface is proximate to the respective open front ends;
   a second member coupled to the first member via a hinge, wherein the hinge enables the second member to move between a first position that inhibits removal or insertion of the one or more modules from the computer chassis via the respective open front ends during use, wherein said inhibiting comprises a portion of the second member at least partially blocking the respective open front ends, and a second position that facilitates removal or insertion of the one or more modules from the computer chassis via the respective open front ends during use; and
   a locking mechanism that selectively locks the second member in the first position to inhibit removal or insertion of the one or more modules from the computer chassis via the respective open front ends during use, wherein, to lock the second member in the first position, the locking mechanism fixable couples the first member to the second member, thereby holding the second member in the first position.

2. The system of claim 1, wherein the locking mechanism is selectively unlocked during use to facilitate removal or insertion of the one or more modules from the computer chassis via the respective open front ends during use.

3. The system of claim 1, wherein the first member is mechanically coupled to the first surface of the computer chassis during use.

4. The system of claim 1, wherein the first member is coupled to the first surface of the computer chassis during use via an adhesive.

5. The system of claim 1, wherein the first member is coupled to the first surface of the computer chassis during use via a mechanical fastener.

6. The system of claim 1, wherein the locking mechanism comprises a keyed fastener that fixable couples the first member to the second member during use.

7. A modular computer system, comprising:
- a chassis comprising one or more slots configured to house one or more removable modules during use, wherein the one or more modules are removed from or installed into the chassis via respective open ends of the one or more slots; and
- a module locking device comprising:
  - a first member coupled to a first surface of the chassis proximate to the open front ends during use; and
  - a second member coupled to the first member via a hinge, wherein the hinge enables the second member to move between a first position that inhibits removal or insertion of the one or more modules from the chassis via the respective open front ends during use, wherein said inhibiting comprises a portion of the second member at least partially blocking the respective open front ends, and a second position that facilitates removal or insertion of the one or more modules from the chassis via the respective open front ends during use and
  - a locking mechanism that selectively locks the second member in the first position to inhibit removal or insertion of the one or more modules from the chassis via the respective open front ends during use, wherein, to lock the second member in the first position, the locking mechanism fixably couples the first member to the second member, thereby holding the second member in the first position.

8. The system of claim 7, wherein the locking mechanism is selectively unlocked during use to facilitate removal or insertion of one or more modules from the chassis via the respective open front ends during use.

9. The system of claim 7, wherein the first member is mechanically coupled to the first surface of the chassis during use.

10. The system of claim 7, wherein the first member is coupled to the first surface of the chassis during use via an adhesive.

11. The system of claim 7, wherein the first member is coupled to the first surface of the chassis during use via a mechanical fastener.

12. The system of claim 7, wherein the locking mechanism comprises a keyed fastener that fixably couples the first member to the second member.

13. A modular computer system, comprising:
- a chassis comprising one or more slots configured to house one or more removable modules during use, wherein the one or more modules are removed from or installed into the chassis via respective open ends of one or more of the slots during use; and
- a module locking device comprising:
  - a first member coupled to a first surface of the chassis proximate to the respective open ends during use;
  - a second member coupled to the first member, wherein, during use, the second member moves relative to the first member and the chassis, between a first position that inhibits removal or insertion of the one or more modules from the chassis via the respective open front ends during use, wherein said inhibiting comprises a portion of the second member at least partially blocking the respective open front ends, and a second position that facilitates removal or insertion of one or more modules from the chassis via the respective open front ends during use; and
  - a locking mechanism that selectively locks the second member in the first position to inhibit removal or insertion of the one or more modules from the chassis via the respective front ends during use, wherein, to lock the second member in the first position, the locking mechanism fixably couples the first member to the second member, thereby holding the second member in the first position.

14. The system of claim 13, wherein the locking mechanism comprises a keyed fastener that fixably couples the first member to the second member.

* * * * *

UNITED STATES PATENT AND TRADEMARK OFFICE
CERTIFICATE OF CORRECTION

PATENT NO. : 8,503,184 B2  
APPLICATION NO. : 12/770377  
DATED : August 6, 2013  
INVENTOR(S) : John N. Hanna Page 1 of 1

It is certified that error appears in the above-identified patent and that said Letters Patent is hereby corrected as shown below:

In the Claims:

Claim 6, Column 13, Line 8, please delete "fixable" and substitute -- fixably --;

Claim 7, Column 13, Line 29, please delete "during use and" and substitute -- during use; and --.

Signed and Sealed this  
Fifteenth Day of October, 2013

Teresa Stanek Rea  
*Deputy Director of the United States Patent and Trademark Office*